United States Patent

[11] 3,614,472

[72] Inventor Nico J. Kloppenborg
Seaton, Australia
[21] Appl. No. 829,920
[22] Filed June 3, 1969
[45] Patented Oct. 19, 1971
[73] Assignee U.S. Philips Corporation
New York, N.Y.
[32] Priority July 17, 1968
[33] Australia
[31] 39268

[54] SWITCHING DEVICE
7 Claims, 2 Drawing Figs.

[52] U.S. Cl. .......... 307/255, 307/249
[51] Int. Cl. .......... H03k 17/60
[50] Field of Search .......... 307/255, 249, 257

[56] References Cited

UNITED STATES PATENTS 3,031,588 4/1962 Hilsenrath .......... 307/255
3,077,545 2/1963 Rywak .......... 307/255
3,179,817 4/1965 Bounsall .......... 307/257
3,222,547 12/1965 Boan et al. .......... 307/257

*Primary Examiner*—Donald D. Forrer
*Assistant Examiner*—Harold A. Dixon
*Attorney*—Frank R. Trifari

ABSTRACT: A switching circuit comprising a resistance bridge and a signal transmission path including a pair of switching transistors of opposite conductivity connected in parallel across one diagonal of the bridge to form complementary signal paths. A source of DC voltage is connected to the other diagonal of the bridge. The base electrodes of the switching transistors are connected to opposite terminals of the DC source, each via a diode and a base-keying transistor in series. A common control transistor provides a means for simultaneously blocking and unblocking the base-keying transistors whereby the switching transistors are simultaneously blocked or unblocked.

INVENTOR.
NICO J. KLOPPENBORG
BY
AGENT

SWITCHING DEVICE

The present invention provides an improved switching device capable of switching high-frequency signals with a high on/off ratio and which in certain of its forms permits the switching of such signals having a high amplitude level.

A switching circuit in accordance with the present invention comprises a signal transmission path formed by the emitter/collector paths of at least one pair of switching transistors of opposite conductivity type forming two parallel and complementary paths across one diagonal of a resistance bridge. The remaining bridge diagonal is connected across the terminals of a source of DC potential. The respective base electrodes of the switching transistors are connected to opposite terminals of the source, each via the colletor/emitter path of an associated base-keying transistor. A unidirectional current-conducting device is serially connected between the base electrode of each switching transistor and its associated base-keying transistor, means being provided for simultaneously blocking and unblocking the base-keying transistors whereby the switching transistors are simultaneously blocked or unblocked.

In a particular form, the signal transmission path of the switching circuit according to the present invention is the path formed by the emitter/collector paths of at least two pairs of switching transistors, the transistors of each pair being of opposite conductivity type, the emitter/collector paths of the transistors of like conductivity types being serially connected thereby forming two complementary chains across said one diagonal of said resistance bridge.

Preferably the base electrode of each base-keying transistor associated with a switching transistor of the one conductivity type is connected to the collector electrode of a common control transistor and the base electrode of each base-keying transistor associated with a switching transistor of the opposite conductivity type is connected to the emitter electrode of said control transistor. The collector and emitter electrodes of the control transistor are respectively connected via a collector resistance and an emitter resistance to terminals of said source of DC potential. Means are provided for blocking and unblocking the control transistor to effect simultaneous blocking or unblocking of the base-keying transistors.

Preferred embodiments of the invention will now be described with reference to the accompanying drawings in which.

Figure 1:
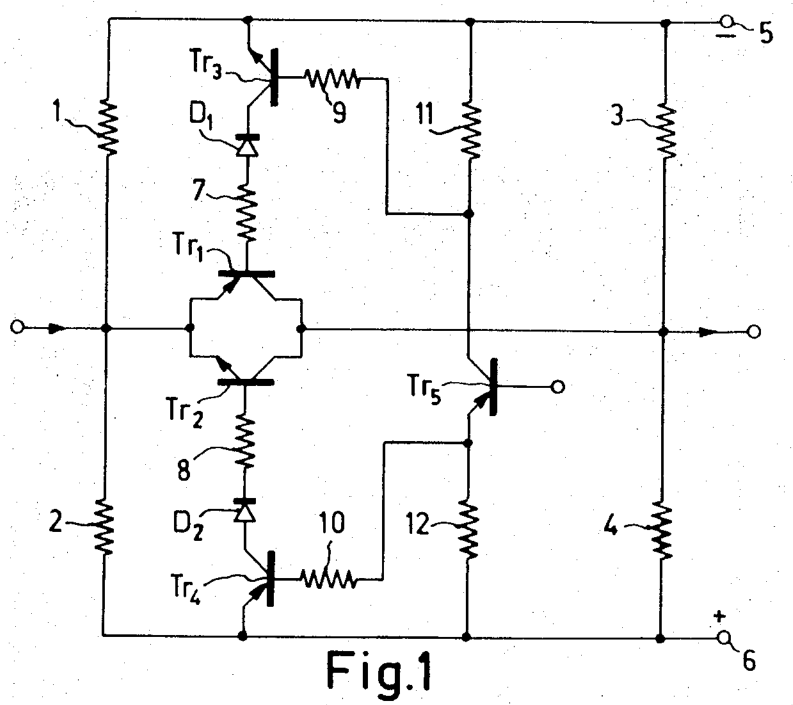
FIG. 1 illustrates diagrammatically a switching device in accordance with the invention employing a single pair of switching transistors.

Referring to FIG. 1, the input signals are supplied to the emitter electrodes of the switching transistors TR1 and TR2, the output signals being taken from their collector electrodes. The transistors TR1 and TR2 are opposite conductive types, transistor TR1 being an NPN-type and transistor TR2 being a PNP-type. The emitter/collector paths of the transistors TR1 and TR2 are connected in a parallel and complementary relationship so that when the transistors are in an unblocked state they provide a transmission path for the signals. The emitter/collector path of the transistor TR1 conducts positive-going input signals or portions of input signals and the emitter/colletor path of the transistor TR2 conducts negative-going input signals or portions of input signals. The emitter/collector paths of the transistors TR1 and TR2 are connected across one diagonal of a resistance bridge network formed by the resistances 1, 2, 3 and 4. To obtain symmetrical operation of the transistors TR1 and TR2 and maximum signal-handling capacity, the emitters of TR1 and TR2 must have half the supply voltage, for example, by means of equal value resistors R1 and R2. In order to reduce the switch ON pulses, the collectors of TR1 and TR2 must also have half the supply voltage, for example, by means of equal value resistors R3 and R4. The remaining diagonal of the bridge network is connected across a source of DC potential which is not shown but is represented by the negative terminal 5 and the positive terminal 6. A base-keying transistor TR3 is associated with the transistor TR1 and a base-keying transistor TR4 is associated with the transistor TR2. The collector/emitter path of the transistor TR3 connects the base electrode of the transistor TR1 to the negative terminal 5 of the DC source and the collector/emitter path of the transistor TR4 connects the base electrode of the transistor TR2 to the positive terminal 6 of the DC source. A semiconductor diode D1 serially connected with a resistance 7 connects the base electrode of the transistor TR1 to the collector electrode of the transistor TR3 and similarly a semiconductor diode D2 serially connected with a resistance 8 connects the base electrode of the transistor TR2 to the collector electrode of the transistor TR4. The base electrode of the transistor TR3 is connected via the current-limiting resistance 9 to the collector of the transistor TR5 and the base electrode of the transistor TR4 is connected via the current-limiting resistance 10 to the emitter electrode of the transistor TR5. The collector electrode of the transistor TR5 is connected via the collector resistance 11 to the negative terminal 5 of the DC source and the emitter electrode of the transistor TR5 is connected via the emitter resistance 12 to the positive terminal 6 of the DC source. To obtain symmetrical operation the resistors 9 and 10 must provide the respective driving currents for TR3 and TR4, i.e., for matched gain figures of TR3 and TR4, resistors 9 and 10 are equal if the collector voltage of TR5 in the saturated condition equals half the supply voltage. The voltage on the emitter and collector of TR5 is determined by the base voltage.

Means (not shown) are provided for blocking and unblocking the transistor TR5. The means may, for example, comprise a resistance and a manually operated switch connected between the negative terminal 5 and the base electrode of the transistor TR5, the value of the resistance being such that closure of the switch unblocks the transistor TR5 and opening of the switch blocks the transistor TR5. Alternatively, a signal having a rectangular wave shape may be fed from an appropriate source to the base electrode of the transistor TR5 for periodically blocking and unblocking the transistor.

When the transistors TR1, TR2, TR3, TR4 and TR5 are all in a blocked condition, the emitter and the collector electrodes of the transistors TR1 and TR2 are at the same potential (i.e., at half the voltage of the DC supply source) and the potential of the collector electrode of the transistor TR5 is at the potential of the negative terminal 5 whereas the potential of the emitter electrode of the transistor TR5 is at the same potential as the positive terminal 6. It will be appreciated however that when the transistor TR5 is unblocked, its collector voltage becomes approximately half the supply voltage and likewise its emitter voltage becomes approximately half the supply voltage if the base of transistor TR5 is connected to a voltage source equal to half the supply voltage. Accordingly, the base voltage of the transistor TR3 rises, unblocking transistor TR3 and consequently unblocking the transistor TR1. In addition, the base voltage of the transistor TR4 falls, unblocking the transistor TR4 and consequently unblocking the transistor TR2.

The semiconductor diodes D1 and D2 prevent reverse base current flow in transistor TR1 and TR2, respectively, for signal voltages exceeding the base/emitter breakdown voltage. The resistors 7 and 8 provide AC isolation.

The switching circuit of FIG. 1 has a typical series impedance of 20 ohms and an on/off ratio of 60 decibels with signal frequencies of up to 700 kilocycles. Switching speeds of 10 microseconds have been obtained. The signal levels that the arrangement is capable of handling depends upon the characteristics of the transistors TR1 and TR2 and upon the supply voltage of the source. An improvement of the on/off ratio and/or signal-handling capacity may be achieved by employing more than a single pair of switching transistors. An arrangement employing three pairs of switching transistors is illustrated in FIG. 2 of the accompanying drawing.

Figure 2:
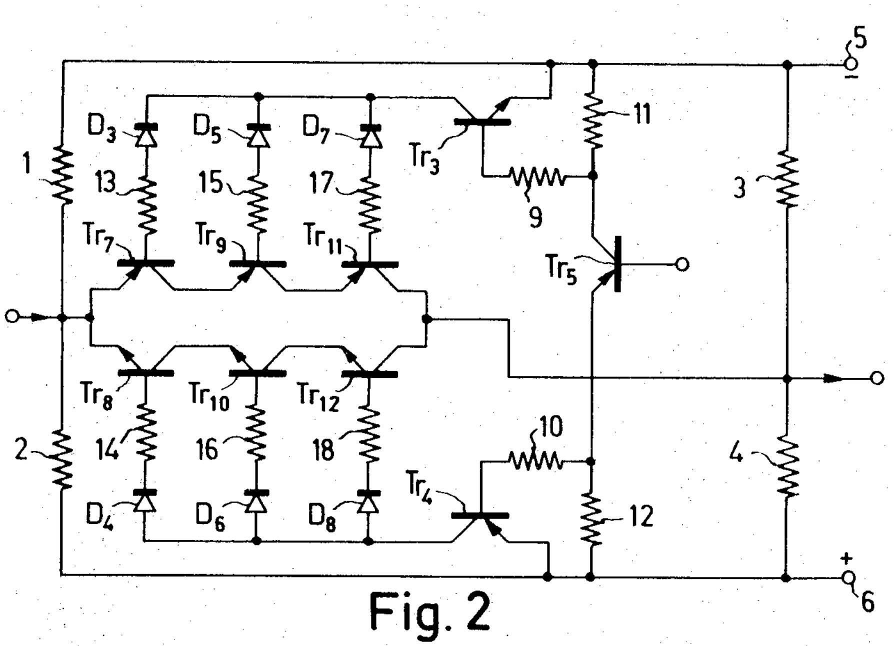
FIG. 2 illustrates diagrammatically a switching device in accordance with the invention employing three pairs of switching transistors.

In FIG. 2 the arrangement is somewhat similar to that of FIG. 1 and equivalent components have been designated by similar reference symbols or numbers. The transistor TR1 of FIG. 1 has been replaced in FIG. 2 by the transistors TR7, TR9 and TR11, the emitter/collector paths of which are connected in series between the junction of the resistances 1 and 2 and the junction of the resistances 3 and 4. Likewise, the transistor TR2 of FIG. 1 has been replaced in FIG. 2 by the transistors TR8, TR10 and TR12, the emitter/collector paths of which are connected in series between the junction of the resistances 1 and 2 and the junction of the resistances 3 and 4. The base electrode of each of the transistors TR7, TR9 and TR11 is connected via a resistance and a semiconductor diode to the collector electrode of the transistor TR3 and likewise the base electrode of each of the transistors TR8, TR10 and TR12 is connected via a resistance and semiconductor diode to the collector electrode of the transistor TR4. It will be appreciated that the blocking and unblocking of the transistor TR3 results in the blocking and unblocking simultaneously of the three transistors TR7, TR9 and TR11 and that the blocking and unblocking of the transistor TR4 results in the blocking and unblocking simultaneously of the three transistors TR8, TR10 and TR12. When the transistors TR7, TR8, TR9, TR10, TR11 and TR12 are in the unblocked condition, their emitter/collector paths provide a transmission path for the input signals applied to the emitter electrodes of the transistors TR7 and TR8. The series arrangement of the emitter/collector paths of the transistors TR7, TR9 and TR11 conducts the positive-going input signals or portions of input signals and the series arrangement of the emitter/collector paths of the transistors TR8, TR10 and TR12 conducts the negative-going input signals or portions of input signals.

In the circuit of FIG. 2, the presence of a serially connected resistance and diode in the base circuit of each of the switching transistors TR7, TR8, TR9, TR10, TR11 and TR12 is considered essential in order to obtain good AC isolation and linear operation of the circuit.

What is claimed is:

1. A transistor-swtiching circuit comprising a resistance bridge, a signal transmission path formed by the emitter/collector paths of at least one pair of switching transistors of opposite conductivity type forming two parallel and complementary paths across one diagonal of the resistance bridge, means connecting the remaining bridge diagonal across the terminals of a source of DC potential, means connecting the respective base electrodes of the switching transistors to opposite terminals of the source, each via the collector/emitter path of an associated base-keying transistor, a unidirectional current-conducting device serially connected between the base electrode of each switching transistor and its associated base-keying transistor, means being provided for simultaneously blocking and unblocking the base-keying transistors whereby the switching transistors are simultaneously blocked or unblocked.

2. A circuit as claimed in claim 1, characterized in that said signal transmission path is formed by the emitter/collector paths of at least two pairs of switching transistors, the transistors of each pair being of opposite conductivity type, the emitter/collector paths of the transistors of like conductivity type being serially connected thereby forming two complementary paths across said one diagonal of said resistance bridge.

3. A circuit as claimed in claim 2, characterized in that the base electrode of each base-keying transistor associated with a switching transistor of the one conductivity type is connected to the collector electrode of a common control transistor and the base electrode of each base-keying transistor associated with a switching transistor of the opposite conductivity type is connected to the emitter electrode of said control transistor, the collector and emitter electrodes of the control transistor being respectively connected via a collector resistance and an emitter resistance to terminals of said source of DC potential, and means being provided for blocking and unblocking the control transistor to effect simultaneously blocking or unblocking of the base-keying transistors.

4. A circuit as claimed in claim 1 further comprising a common control transistor, means connecting the base electrode of a base-keying transistor associated with a switching transistor of the one conductivity type to the collector electrode of said control transistor and the base electrode of a base-keying transistor associated with a switching transistor of the opposite conductivity type to the emitter electrode of said control transistor, first and second resistors, means respectively connecting the collector and emitter electrodes of the control transistor to the terminals of said DC source via said first and second resistors, respectively, and means coupled to the base electrode of the control transistor for blocking and unblocking the control transistor thereby to simultaneously effect blocking or unblocking of the base-keying transistors.

5. A circuit as claimed in claim 4 wherein said first and second resistors are of substantially equal resistance value.

6. A circuit as claimed in claim 4 wherein the series resistors in one leg of the bridge are substantially equal in value and the series resistors in the other leg of the bridge are substantially equal in value.

7. A circuit as claimed in claim 4 wherein said unidirectional devices comprise semiconductor diodes connected with like polarity between the terminals of the DC source.

PO-1050
(5/69)

UNITED STATES PATENT OFFICE
CERTIFICATE OF CORRECTION

Patent No. 3,614,472 Dated October 19, 1971

Inventor(s) NICO J. KLOPPENBORG

It is certified that error appears in the above-identified patent and that said Letters Patent are hereby corrected as shown below:

On the title page the priority date should read

June 17, 1968 --;

Signed and sealed this 16th day of May 1972.

(SEAL)
Attest:

EDWARD M.FLETCHER,JR.
Attesting Officer

ROBERT GOTTSCHALK
Commissioner of Patents